United States Patent [19]

Storti et al.

[11] Patent Number: 5,029,253

[45] Date of Patent: Jul. 2, 1991

[54] SPATIAL LIGHT MODULATOR USING ELECTRON TRAPPING MATERIALS

[75] Inventors: George M. Storti, Washington, D.C.; Suganda Jutamulia, Rockville; Charles Y. Wrigley, Ijamsville, both of Md.; Emeric I. Podraczky, Bethesda, Md.

[73] Assignee: Quantex Corporation, Rockville, Md.

[21] Appl. No.: 419,479

[22] Filed: Oct. 10, 1989

[51] Int. Cl.$^5$ ............................. G02F 2/00; H03C 7/00
[52] U.S. Cl. .................................... 250/484.1; 250/330
[58] Field of Search ......................... 250/330, 484.1 B; 350/354

[56] References Cited

U.S. PATENT DOCUMENTS 3,868,653  2/1975  Winter .................................. 365/121
4,812,660  3/1989  Lindmayer ....................... 250/484.1

Primary Examiner—Constantine Hannaher
Assistant Examiner—Drew A. Dunn
Attorney, Agent, or Firm—Ostrolenk, Faber, Gerb & Soffen

[57] ABSTRACT

A novel, high-speed spatial light modulator utilizing electron trapping materials. The electron trapping material is exposed to a pattern of modulating radiation, resulting in the excitation of electrons in the material at spatial locations corresponding to the pattern. When the light to be modulated (ordinarily coherent light) is simultaneously or subsequently passed through the material, it is absorbed in areas of the material where electrons have been excited. The unabsorbed light passes through the electron trapping material, producing a negative image of the pattern of modulating radiation. The electron trapping material also emits an image of incoherent visible light as the released electrons fall back to the ground state. This visible image can be filtered out if the device is only being used for modulating coherent light. Conversely, the device can be utilized by detecting only the incoherent visible emission from the electron trapping material, which constitutes a multiplicative product image of the electron exciting and electron releasing light incident on the electron trapping material.

24 Claims, 3 Drawing Sheets

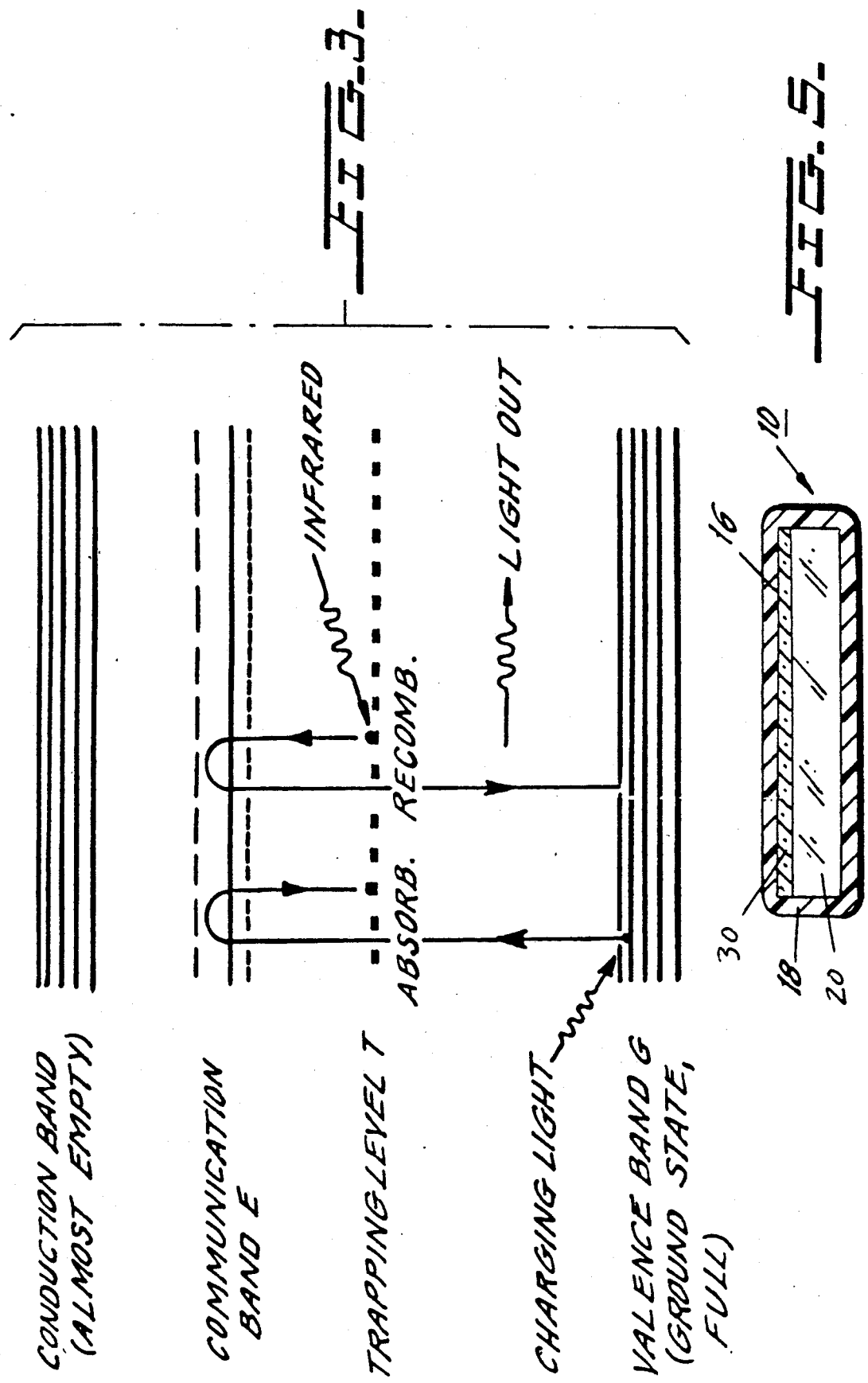

SPATIAL LIGHT MODULATOR USING ELECTRON TRAPPING MATERIALS

BACKGROUND OF THE INVENTION

1. Field of the Invention

The present invention relates to spatial light modulators and, more specifically, to a novel high-speed, spatial light modulator using electron trapping materials.

2. Description of the Related Art

Spatial light modulators are devices that modify the phase, polarization, amplitude, or intensity of a one-dimensional or two-dimensional readout light distribution as a function of space and time. Such modulators can be electrically or optically addressed Most are based on polarization modulation generated by electrooptic or other effects. The proper orientation of an analyzer between the spatial light modulator and a detector will further result in either phase or amplitude modulation.

Another class of spatial light modulators relies on the volume grating generated in photo-refractive materials. Recently, fast response, multiple quantum well spatial light modulators that make use of direct energy absorption in III-V compounds to modulate the light amplitude have been proposed and demonstrated. Fabrication of these types of modulators is based on a sophisticated semiconductor technology, e.g., molecular beam epitaxy of alternating thin layers of III-V compounds. For a more detailed description of prior art spatial light modulators and multiple quantum well structures, see A. R. Tanguay, Jr., "Materials Requirements for Optical Processing and Computing Devices," Optical Engineering, Jan./Feb. 1985, Vol. 24; No. 1, pp. 002-018, herein incorporated by reference.

Although spatial light modulation by direct energy absorption is highly desirable because of its relatively high speed and fine resolution, the fabrication of multiple quantum well structures is complicated and expensive. Accordingly, it would be desirable if this function could be performed by a material deposited in a simple, thin film layer.

SUMMARY OF THE INVENTION

Accordingly, an object of the invention is to provide a novel, high-speed spatial light modulator formed of a material deposited on a substrate using standard thin film technology, such as physical vapor deposition, or even thin layers of material in powder form.

Another object of the invention is to provide a spatial light modulator with high resolution; i.e., greater than 5 lp/mm, with a fast response time.

Another object of the invention is to provide a spatial light modulator with long-term memory storage.

These and other objects are achieved by a spatial light modulator formed of an electron trapping material disposed upon the substrate. The electron trapping material is exposed to a pattern of modulating radiation, resulting in the excitation of electrons in the material at spatial locations corresponding to the pattern. When the light to be modulated is subsequently passed through the material, it is absorbed in areas of the material where electrons have been excited. The unabsorbed light passes through the electron trapping material, producing a negative image of the pattern of modulating radiation.

Thus, for example, blue light may be utilized to modulate coherent infrared radiation. A pattern of blue light written onto the electron trapping material results in the excitation of electrons in the material in locations corresponding to the pattern of the blue light. Incident coherent infrared radiation is selectively absorbed by the electron trapping material in these locations where electrons have been excited by the blue light. The coherent infrared radiation passes through the electron trapping material in the non-exposed areas and forms a "negative" modulated image A filter may be used to filter out the incoherent visible light released from the electron trapping material as a result of the absorption of the infrared radiation and the accompanying release of excited electrons from their traps. The blue modulating light must also be filtered out if it is incident on the electron trapping material simultaneously with the infrared. Conversely, an image of the multiplicative product of the incident blue and infrared light can be obtained by filtering out the coherent infrared radiation (and the blue modulating light, if simultaneous) and detecting only the incoherent visible light emitted from the electron trapping material.

Similarly, an infrared image may be used to modulate coherent blue light by continuously illuminating the electron trapping material with coherent blue light and during that time exposing the material to a pattern of infrared radiation. The infrared radiation releases trapped electrons in the electron trapping material at the exposed locations, resulting in the emission of incoherent visible light. The incoming coherent blue light is selectively absorbed at these locations as it acts to excite ground state electrons back into energy traps. Thus, the coherent blue light which passes through constitutes a negative image of the modulating infrared radiation. Conversely, the incoherent light emitted from the electron trapping material provides a positive multiplicative image of the incident coherent blue light and infrared radiation The electron trapping material utilized in the present invention is formed of an alkaline earth metal sulfide base doped with at least two rare earth impurities. The base material is preferably strontium sulfide and/or calcium sulfide. The first dopant is preferably samarium or a samarium compound. The second dopant is preferably a europium compound, a cerium compound or a combination of cerium and europium compounds.

BRIEF DESCRIPTION OF THE DRAWINGS

The above and other features and advantages of the present invention will become apparent when the following detailed description is read in conjunction with the accompanying drawings, in which:

FIG. 3 shows the principles of operation of the electron trapping material used in the present invention.

FIG. 5 shows a cross-section of the spatial light modulator of the present invention.

DETAILED DESCRIPTION OF THE PREFERRED EMBODIMENTS

Electron trapping materials are wide bandgap, II-VI compound semiconductors (Eg TM 4 eV) into which two dopant species have been introduced. Short wavelength, visible light is absorbed by one of the dopants, and the resultant excited electrons transfer to the second dopant without passing through the conduction band. The electrons can remain trapped in the ground state of the second dopant for very long periods of time (months to years). Subsequent near infrared light is absorbed by the trapped electrons, and the electrons transfer back to an excited state of the first dopant and return to the ground state with the emission of visible light having a wavelength which depends upon the composition of the material.

Figure 1:
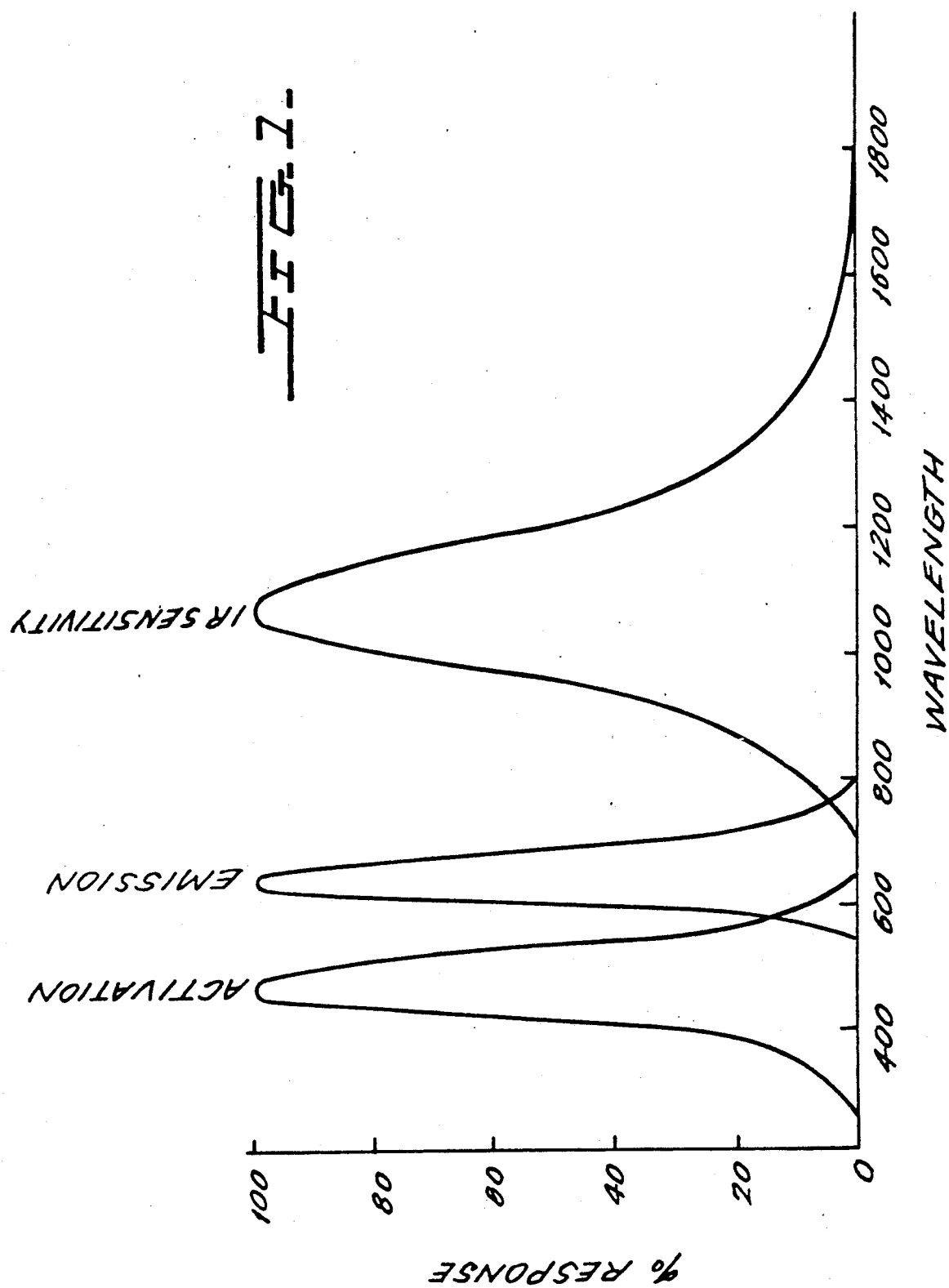
FIG. 1 shows the excitation, activation and emission spectra of a typical electron trapping material utilized in the invention.

The electron trapping material of the present invention is formed of an alkaline earth metal sulfide base doped with rare earth impurities. A number of different electron trapping materials have been developed by the assignee of the present application For example, U.S. Pat. No. 4,839,092 discloses a material formed of a strontium sulfide base doped with samarium and europium (SrS:Sm,Eu). This material outputs orange light centered at 620 nm. Similarly, U.S. Pat. No. 4,842,960 discloses a material formed of a mixed strontium sulfide/calcium sulfide base doped with samarium and europium/cerium (SrS/CaS:Sm,Eu/Ce). This material also emits orange light, but has a very high efficiency and a brighter output than the material without calcium sulfide. As shown in FIG. 1, the activation wavelength of this preferred SrS/CaS:Sm,Eu/Ce material is about 450 nm, its emission wavelength is orange (about 630 nm) and its stimulation wavelength is near-infrared U.S. Pat. No. 4,879,186 discloses a material formed of a calcium sulfide base doped with samarium and europium (CaS:Sm,Eu), which outputs a reddish-orange light centered at 650 nm.

Each of the above electron trapping materials have electron traps with depths of about 1.0 to 1.2 electron volts. Further details of the materials and the processes for making the materials are set forth in the disclosures of each of the above-referred U.S. patents, which are herein incorporated by reference.

It has been discovered that because of their unique photonic properties, the electron trapping materials described in the above-noted patents can be used to form a novel spatial light modulator.

Figure 2:
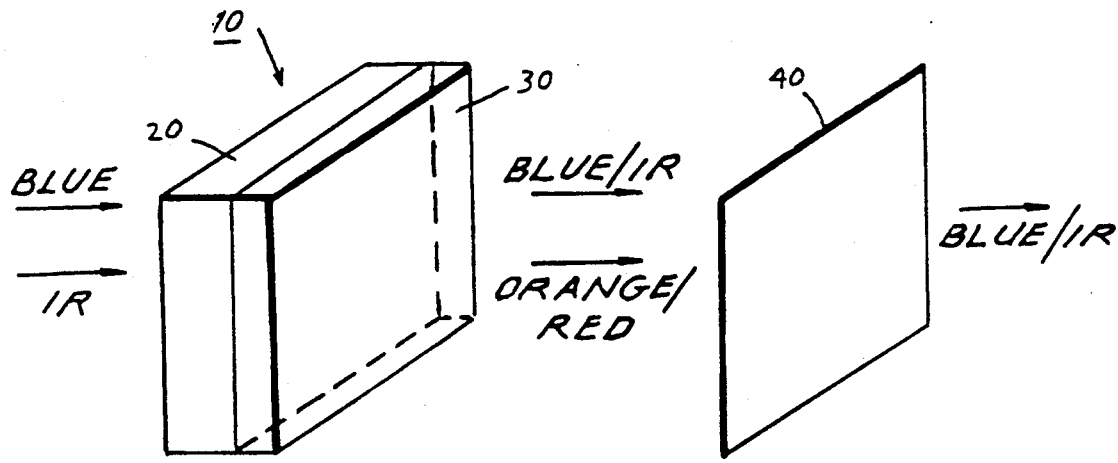
FIG. 2 shows the basic structure of the spatial light modulator of the invention operating in a coherent light read-out mode.

Referring to FIG. 2, the spatial light modulator of the invention, identified generally by reference numeral 10, includes a substrate 20, a thin film of electron trapping material 30 and a filter 40.

Modulating light within the activation band of the electron trapping material (such as blue light or broadband white light, coherent or incoherent), is used to write an image or pattern in the electron trapping thin film layer 30 through substrate 20, which is suitably transparent. Areas of electron trapping material 30 upon which the blue or white light is incident become charged or activated, meaning that electrons in these areas are raised from a ground level G to a communication band E (see FIG. 3), from which the electrons drop into a trapping level T. The resulting trapped electron density is directly proportional to the intensity/time of the write illumination at each location, provided that saturation of the traps does not occur.

Incoming coherent infrared radiation within the stimulation band (infrared sensitivity) of the electron trapping material (from, for example, a Nd:YAG laser or laser diode) is modulated by its absorption in the regions of electron trapping material 30 which are charged or activated by the blue light. In locations where it is absorbed, the energy from the infrared light raises trapped electrons up out of their traps and into a communication band E for recombination whereupon they may move back to the ground level G and output visible light in the process (see FIG. 3). Infrared radiation passing through the unactivated regions of material 30 is not absorbed and may be detected by any suitable means (not shown). A filter 40 is used to filter out the orange/red incoherent light emitted from the electron trapping material, and also the modulating blue light (if the blue light is applied simultaneously with the modulated infrared light).

In the above-described manner, a spatial light modulator is provided wherein infrared radiation is modulated by blue or broadband light. Thus, a coherent, optical processing method is achieved. The resultant infrared radiation image will be an inverse (or negative) image of the original blue light image written on layer 30. However, it will be readily understood that an inverse image could be written to the electron trapping material 30 and the coherent infrared image produced would then be a positive image.

An alternative method is to continuously illuminate the electron trapping material 30 with coherent blue light (from, for example, an argon laser) and modulate the blue light with an infrared (coherent or incoherent) image. The blue light will experience increased absorption in the regions of electron trapping layer 30 subjected to infrared radiation as the energy from the blue light is used to raise electrons to the communication band E. The absorption of blue light at the locations of the infrared image is proportional to the spatially varying infrared intensity. Regions of electron trapping material 30 not subjected to infrared radiation will transmit the coherent blue light in an image which is the negative of the infrared original. The coherent, blue light image may be detected by any suitable means. Filter 40 is provided to filter out the modulating infrared light and the orange/red incoherent light emitted from the electron trapping material.

Readout of the spatial light modulator will now be discussed in greater detail. In the infrared radiation readout mode (i.e., when coherent infrared radiation is modulated by blue light), the blue light can be applied simultaneously with the modulated infrared, or it can be applied prior to the infrared to store memory which physically is a pattern of trapped electrons. The memory can be stored for a long period of time. The spatial light modulator is a write-once read-many (WORM) memory for this readout mode. Since the electron trapping film is several microns thick and the substrate is transparent, the incident infrared radiation will pass through the modulator if there are no trapped electrons. If a pattern of trapped electrons has been written by blue light, a portion of readout infrared radiation will be absorbed, and incoherent orange/red light will be emitted according to the pattern of trapped electrons (memory). Due to the filter placed behind the thin film, only the unabsorbed infrared radiation will be detected. This modulated infrared radiation may be expressed as follows:

$$f(x,y) = 1 - k\, g(x,y)$$

where:

$$0 \leq f(x,y) \leq 1;$$

$$0 \leq g(x,y) \leq 1;$$

and k is a constant depending on the absorption coefficient of the thin film, and g(x,y) is the memory written by blue light. It is important to note that the transmitted light maintains its coherence Therefore, an incoherent image illuminated or written with blue light or white light (natural light) can be converted into a coherent infrared (negative) image If nonuniform infrared illumination is used, the modulated output will be:

$$f(x,y) = h(x,y)[1 - k\, g(x,y)]$$

where:

$$0 \leq f(x,y) \leq 1;$$
$$0 \leq h(x,y) \leq 1;$$
$$0 \leq g(x,y) \leq 1;$$

and h(x,y) is the infrared illumination spatial function.

In the blue light readout mode, infrared radiation is used to modulate incident coherent blue light. Since infrared radiation cannot trap electrons when they are in their stable state, this mode is employed for realtime modulation. The modulated functions are also expressed by the above equations. In this mode, coherent or incoherent infrared radiation can modulate coherent blue light.

It will be understood that filter 40 is selected depending upon the wavelength of the electron trapping material emission and, in the case of simultaneous incident modulating and modulated light, the filter is also selected to absorb the modulating light desired to be filtered out. For example, when the modulating beam is blue light and the electron trapping material emission is orange light, an filter that absorbs orange and blue light is employed.

Figure 4:
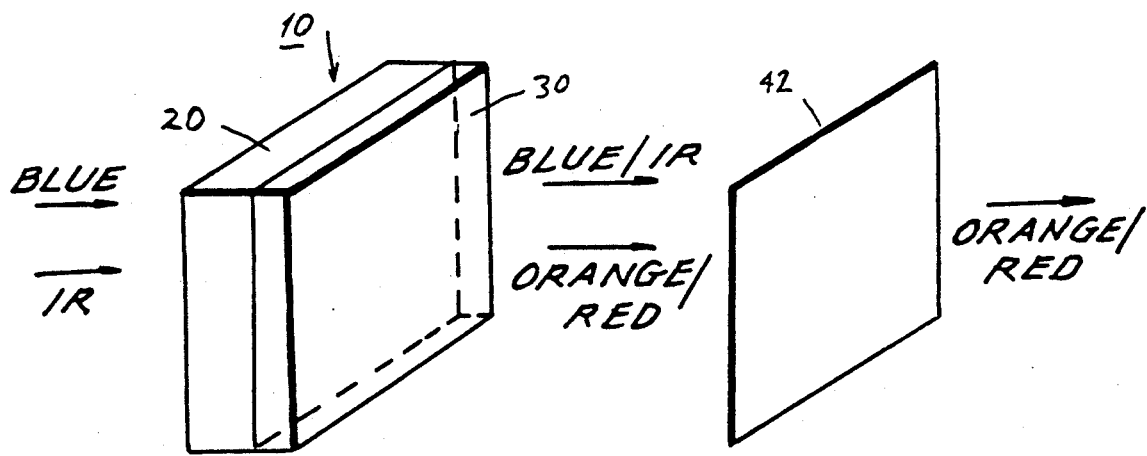
FIG. 4 shows the modulator operating in an incoherent light readout mode.

A spatial light modulator which provides an incoherent light output may be provided in a manner similar to the coherent modulator discussed above. Referring to FIG. 4, in this mode, electron trapping material 30 is exposed to a blue light pattern, activating corresponding locations of material 30. Infrared radiation sent through electron trapping material 30 is absorbed in the activated regions, resulting in the emission of incoherent orange/red light. This emission may be detected by any suitable means. Infrared radiation incident on material 30 in regions which are not activated passes through material 30 and is suitably filtered out by filter 42. Thus, the infrared radiation is multiplied with the blue light to produce a modulated emission of incoherent orange/red light from the electron trapping material 30. The red/orange image produced is a multiplicative product image of the patterns of the blue and infrared light written onto the electron trapping material. The multiplicative product output will be:

$$f(x,y) = k\, h(x,y)\, g(x,y)$$

where:

$$0 \leq f(x,y) \leq 1;$$
$$0 \leq h(x,y) \leq 1;$$
$$0 \leq g(x,y) \leq 1;$$

where h(x,y) and g(x,y) are the infrared and blue illumination spatial functions, respectively, and k is a constant.

In the above-described incoherent mode, filter 42 is an infrared filter or both blue light and infrared filter depending upon whether the images are written sequentially or simultaneously with blue light and infrared radiation.

The physical structure of the spatial light modulator will now be described in greater detail. As illustrated in FIG. 5, modulator 10 is a card shown in vertical cross-section having a substrate 20 and the electron trapping material 30 applied with a transparent binder to the substrate 20. The substrate 20 may be any transparent material such as glass, quartz or sapphire. The material 30 establishes a planar surface 16. An optical transparent coating 18 may encapsulate the material 30 and substrate 20.

As mentioned previously, material 30 is preferably deposited upon substrate 20 using thin film techniques, preferably by physical or chemical vapor deposition. Details concerning the preferred thin film deposition process are set forth in the present assignee's U.S. Pat. No. 4,830,875 and Ser. No. 184,263, filed April 21, 1988, which are herein incorporated by reference.

Although the present invention has been described in connection with a preferred embodiment thereof, many other variations and modifications will now become apparent to those skilled in the art without departing from the scope of the invention. It is preferred, therefore, that the present invention not be limited by the specific disclosure herein, but only by the appended claims.

What is claimed is:

1. A spatial light modulator, comprising:
   a substrate; and
   an electron trapping material disposed on said substrate, said electron trapping material having a plurality of energy levels including a ground level and a trapping level, electrons in said material being raised from said ground level to said trapping level at selected locations when said locations are subjected to modulating radiation comprising electromagnetic radiation of a first wavelength within an activation bandwidth of said electron trapping material, the electrons in said trapping level at said selected locations being released from said trapping level and falling back to said ground level resulting in the emission of incoherent light when said locations are subjected to electromagnetic radiation of a second wavelength within a stimulation bandwidth of said electron trapping material, the electromagnetic radiation of a second wavelength being absorbed by said electron trapping material at said selected locations and being unabsorbed by said electron trapping material at all other locations to form a modulated image.

2. A spatial light modulator as recited in claim 1, wherein said electromagnetic radiation of a second wavelength comprises coherent radiation and said modulated image is a negative image comprising unabsorbed coherent radiation which passes through the electron trapping material.

3. A spatial light modulator as recited in claim 2, wherein said modulating radiation comprises blue light and said electromagnetic radiation of a second wavelength comprises coherent infrared radiation.

4. A spatial light modulator as recited in claim 2, further comprising a filter for filtering out the incoherent light emitted from the electron trapping material when said electromagnetic radiation of a second wavelength is incident onto said electron trapping material sequentially after said modulating radiation has been applied to said electron trapping material.

5. A spatial light modulator as recited in claim 2, further comprising a filter for filtering out both said modulating radiation and the incoherent light emitted from the electron trapping material when said modulated radiation and said electromagnetic radiation of a second wavelength are simultaneously incident onto said electron trapping material.

6. A spatial light modulator as recited in claim 1, further comprising a filter for filtering out said electromagnetic radiation of a second wavelength which passes through the electron trapping material when said modulating radiation is applied to said electron trapping material sequentially after said modulating radiation has been applied to said electron trapping material, and only the emission of incoherent light from the electron trapping material at said selected locations is detected, said incoherent light comprising a multiplicative product image of said modulating and electromagnetic radiation of a second wavelength.

7. A spatial light modulator as recited in claim 1, further comprising a filter for filtering out both said electromagnetic radiation of a second wavelength and said modulating radiation when said electromagnetic radiation of a second wavelength and said modulating radiation are simultaneously applied to said electron trapping material, and only the emission of incoherent light from the electron trapping material at said selected locations is detected, said incoherent light comprising a multiplicative product image of said modulating and electromagnetic radiation of a second wavelength.

8. A spatial light modulator, comprising:
a substrate; and
an electron trapping material disposed on said substrate, said electron trapping material having a plurality of energy levels including a ground level and a trapping level, electrons in said material being raised from said ground level to said trapping level at selected locations when said locations are subjected to continuous electromagnetic radiation of a first wavelength within an activation bandwidth of said electron trapping material, the electrons in said trapping level being released from said trapping level and falling back to said ground level at selected locations resulting in the emission of incoherent light when said locations are subjected simultaneously as said electromagnetic radiation of a first wavelength is being applied, to modulating radiation comprising electromagnetic radiation of a second wavelength within a stimulation bandwidth of said electron trapping material, the electromagnetic radiation of a first wavelength being absorbed by said electron trapping material at said selected locations and being unabsorbed by said electron trapping material at all other locations to form a modulated image.

9. A spatial light modulator as recited in claim 8, wherein said electromagnetic radiation of a first wavelength comprises coherent radiation and said modulated image is a negative image comprising unabsorbed coherent radiation which passes through the electron trapping material.

10. A spatial light modulator as recited in claim 9, wherein said modulating radiation comprises infrared radiation and said electromagnetic radiation of a first wavelength comprises coherent blue light.

11. A spatial light modulator as recited in claim 9, further comprising a filter for filtering out both said modulating radiation and the incoherent light emitted from the electron trapping material as said released electrons fall back from said trapping level to said ground level.

12. A spatial light modulator as recited in claim 8, further comprising a filter for filtering out both electromagnetic radiation of a first wavelength and said modulating radiation, and only the emission of incoherent light from the electron trapping material at said selected locations is detected, said incoherent light comprising a multiplicative product image of said modulating and electromagnetic radiation of a first wavelength.

13. A method for spatially modulating light comprising the steps of:
subjecting selected locations of an electron trapping material to modulating radiation comprising electromagnetic radiation of a first wavelength within an activation bandwidth of said electron trapping material, said electron trapping material having a plurality of energy levels including a ground level and a trapping level, said modulating radiation raising electrons in said electron trapping material from said ground level to said trapping level at said selected locations; and
illuminating said electron trapping material with electromagnetic radiation of a second wavelength within a stimulation bandwidth of said electron trapping material, said electromagnetic radiation of a second wavelength being absorbed at said selected locations as it releases electrons in said electron trapping material from said trapping level, said released electrons falling from said trapping level back to said ground level resulting in the emission of incoherent light, said electromagnetic radiation of a second wavelength passing through said electron trapping material at all locations other than said selected locations to form a modulated image.

14. A method for spatially modulating light as recited in claim 13, wherein said electromagnetic radiation of a second wavelength comprises coherent radiation and said modulated image is a negative image comprising unabsorbed coherent radiation which passes through the electron trapping material.

15. A method for spatially modulating light as recited in claim 14, wherein said modulating radiation comprises blue light and said electromagnetic radiation of a second wavelength comprises coherent infrared radiation.

16. A method for spatially modulating light as recited in claim 14, further comprising the step of filtering out the incoherent light emitted from said electron trapping material when said electromagnetic radiation of a second wavelength is incident upon said electron trapping material sequentially after said modulating light has been applied to said electron trapping material.

17. A method for spatially modulating light as recited in claim 14, further comprising the step of filtering out the incoherent light emitted from said electron trapping material when said electromagnetic radiation of a second wavelength and said modulating light are simultaneously incident upon said electron trapping material.

18. A method for spatially modulating light as recited in claim 13, further comprising the step of filtering out said electromagnetic radiation of a second wavelength which passes through the electron trapping material when said modulating radiation is applied to said electron trapping material sequentially after said modulating radiation has been applied to said electron trapping material, and only the emission of incoherent light from the electron trapping material at said selected locations is detected, said incoherent light comprising a multiplicative product image of said modulating and electromagnetic radiation of a second wavelength radiation.

19. A method for spatially modulating light as recited in claim 13, further comprising the step of filtering out both said electromagnetic radiation of a second wavelength radiation and said modulating radiation when said electromagnetic radiation of a second wavelength and said modulating radiation are simultaneously applied to said electron trapping material, and only the emission of incoherent light from the electron trapping material at said selected locations is detected, said incoherent light comprising a multiplicative product image of said modulating and electromagnetic radiation of a second wavelength.

20. A method for spatially modulating light, comprising:

continuously illuminating an electron trapping material with electromagnetic radiation of a first wavelength within an activation bandwidth of said electron trapping material, said electron trapping material having a plurality of energy levels including a ground level and a trapping level, the illumination of said electron trapping material with said electromagnetic radiation of a first wavelength raising electrons in said material from said ground level to said trapping level; and subjecting selected locations of said electron trapping material to modulating radiation comprising electromagnetic radiation of a second wavelength within a stimulation bandwidth of said electron trapping material simultaneously as said electromagnetic radiation of a first wavelength is being applied, the electrons at said selected locations being released from said trapping level and falling to said ground level when subjected to said modulating radiation resulting in the emission of incoherent light at said selected locations, said electromagnetic radiation of a first wavelength being selectively absorbed as it raises electrons in said electron trapping material at said selected locations from said ground level back up to said trapping level, said electromagnetic radiation of a first wavelength passing through said electron trapping material at all other locations to form a modulated image.

21. A method for spatially modulating light as recited in claim 20, wherein said electromagnetic radiation of a first wavelength comprises coherent radiation and said modulated image is a negative image comprising unabsorbed coherent radiation which passes through the electron trapping material.

22. A method for spatially modulating light recited in claim 21, wherein said modulating radiation comprises infrared radiation and said electromagnetic radiation of a first wavelength comprises coherent blue light.

23. A method for spatially modulating light as recited in claim 22, further comprising the step of filtering out both said modulating radiation and the incoherent light emitted from the electron trapping material as said released electrons fall back from said trapping level to said ground level.

24. A method for spatially modulating light as recited in claim 21, further comprising the steps of filtering out both said electromagnetic radiation of a first wavelength and said modulating radiation, and only the emission of incoherent light from the electron trapping material at said selected locations is detected, said incoherent light comprising a multiplicative product image of said modulating and electromagnetic radiation of a first wavelength.

* * * * *